(12) United States Patent
Kiesewetter et al.

(10) Patent No.: US 7,265,536 B2
(45) Date of Patent: Sep. 4, 2007

(54) PROCEDURE FOR REPRODUCTION OF A CALIBRATION POSITION OF AN ALIGNED AND AFTERWARDS DISPLACED CALIBRATION SUBSTRATE IN A PROBE STATION

(75) Inventors: Joerg Kiesewetter, Sacka (DE); Axel Schmidt, Stoelpchen (DE); Stefan Kreissig, Venusberg (DE); Karsten Stoll, Bautzen (DE); Ralph Juettner, Dresden (DE); Hans-Juergen Fleischer, Priestewitz (DE)

(73) Assignee: Suss Microtec Test Systems GmbH, Sacka (DE)

( * ) Notice: Subject to any disclaimer, the term of this patent is extended or adjusted under 35 U.S.C. 154(b) by 1 day.

(21) Appl. No.: 11/365,424

(22) Filed: Mar. 1, 2006

(65) Prior Publication Data
US 2006/0212248 A1 Sep. 21, 2006

(30) Foreign Application Priority Data
Mar. 1, 2005 (DE) .................. 20 2005 003 468 U

(51) Int. Cl.
*G01R 31/02* (2006.01)
*G01R 35/00* (2006.01)

(52) U.S. Cl. .................................................. 324/158.1
(58) Field of Classification Search ...................... None
See application file for complete search history.

(56) References Cited

U.S. PATENT DOCUMENTS 6,708,131 B1 * 3/2004 Laursen et al. ............... 702/95
6,909,984 B2 * 6/2005 Laursen et al. ............. 702/109

* cited by examiner

*Primary Examiner*—Paresh Patel
(74) *Attorney, Agent, or Firm*—Heslin Rothenberg Farley & Mesiti P.C.

(57) ABSTRACT

A wafer probe station is provided with a wafer chuck, a wafer fastened on the chuck by vacuum suction, and a probe needle arrangement above the wafer to test the wafer at high frequencies by contacting selected pads on the wafer and alternately pads on a calibration substrate also fastened on the wafer chuck. A procedure for reproduction of a calibration position of an aligned and afterwards displaced calibration substrate uses first and second measurement systems to calculate a new offset position of the calibration substrate after a second wafer is loaded on the wafer chuck. In a last step, the wafer chuck is driven by a 4axis manipulator stage to the new calibration position from the recent position.

18 Claims, 3 Drawing Sheets

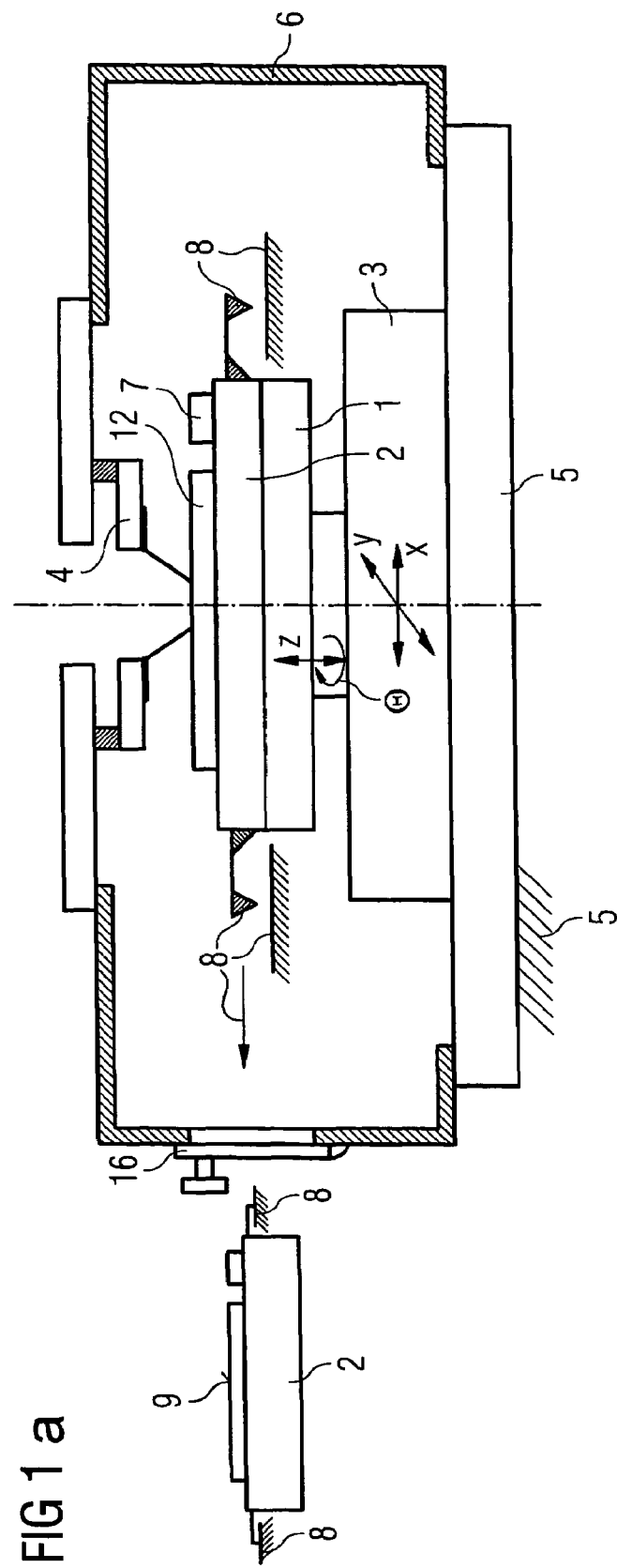

US 7,265,536 B2

PROCEDURE FOR REPRODUCTION OF A CALIBRATION POSITION OF AN ALIGNED AND AFTERWARDS DISPLACED CALIBRATION SUBSTRATE IN A PROBE STATION

TECHNICAL FIELD

The present invention relates generally to the field of wafer probers. Such wafer probers are provided with a wafer chuck and a wafer fastened on the chuck by vacuum suction and provided with probe needle arrangement or contact needles above the wafer to test the wafer at high frequencies by contacting selected pads on the wafer and alternating on a calibration substrate fastened on the wafer chuck.

The invention is directed at a procedure for reproduction of a calibration position of an aligned and afterwards displaced calibration substrate.

BACKGROUND OF THE INVENTION

Known probe stations, also known as wafer probers, for testing semiconductor substrates on wafers under defined conditions consist of a wafer chuck 1, which is connected in some cases with an add-on plate 2 mounted on its top surface and a 4axis manipulator stage 3, connected with the wafer chuck 1. The 4axis manipulator stage 3 can move the wafer chuck 1 relative to a probe needle arrangement 4 assembled above the wafer chuck 1 and the machine frame 5 (FIG. 1). The 4axis manipulator stage can move the wafer chuck 1 and the add-on plate 2 along x, y, z and Theta directions as shown schematically in FIG. 1.

At least the wafer chuck 1 and the add-on plate 2 are often arranged within a chamber 6, providing the required environmental conditions for testing. The accessibility of the wafer chuck surface within the chamber 6 is limited for the operator. This leads to difficulties during loading and unloading of a wafer 12 on add-on plate 2 and occasionally required calibration substrates 7, which are located beside the wafer on the add-on plate (FIG. 1) or the wafer chuck 1 (FIG. 1a).

The wafer 12 is fastened on the wafer chuck 1 or alternatively on the add-on plate 2 (FIG. 1) as well as the calibration substrate 7 is fastened on the wafer chuck 1 (FIG. 1) or the add-on plate 2 by vacuum suction. Therefore the wafer chuck 1 and the add-on plate 2 are connected and disconnected with a suitable vacuum source.

The calibration substrate 7 is provided with contact pads on its top surface (not shown) to be contacted by the tips of the needles of the probe needle arrangement 4 for calibration purposes of a measuring circuit (not shown) connected with the probe needle arrangement 4.

For overcoming the mentioned inconveniences, probe stations are equipped with load support devices 8, which allow the wafer chuck 1 to disconnect from the 4axis manipulator stage 3 or the add-on plate 2 to disconnect from the wafer chuck 1 temporarily, to bring these wafer support surfaces on the wafer chuck 1 or on the add-on plate 2 into a position which is a convenient position 9 for the operator for loading/unloading the wafer 12 and/or the calibration substrate 7 outside the chamber 6 (FIG. 1a). For that purpose, the chamber 6 is provided with a door 16 in the chamber wall.

After reconnection of the wafer-chuck 1 to the 4axis manipulator stage 3 or of the add-on plate 2 to the chuck 1 there remains a displacement 10 (FIG. 2b) of these elements to each other relative to the position before disconnection 11 (FIG. 2a) within several 10 µm, if there are used, cost effective mechanisms for carrying out these loading/unloading movements.

For several measurement purposes there are necessary both elements on the wafer chuck 1—the wafer 12 and the calibration substrate 7. The calibration substrate 7 remains normally connected with the wafer chuck 1 or with the add-on plate 2 during replacement of the wafer 12 with a new wafer 12. Loading a new wafer 12 leads always to a new position of the wafer 12 relative to the wafer stages, i.e. the wafer chuck 1 or the add-on plate 2 FIG. 2b).

It is accepted to perform an alignment of the wafer 12 relative to the probe needle arrangement 4 after loading. However the location of the calibration substrate 7 is expected to remain stable relative to the probe needle arrangement 4, so that a calibration position 15 once set can be reproduced automatically within less than a 5 µm error after loading a new wafer 12. Due to the big displacement of the wafer chuck 1 relative to the 4axis manipulator stage 3 or of the add-on plate 2 relative to the wafer chuck 1 there is required a new teaching of the calibration position of the calibration substrate 7.

This new teaching of the position of the calibration substrate 7 can be realized manually by the operator by visually controlling the reproducing of the calibration position with a suitable microscope. This is very time consuming and not precise enough since the needles of the probe needle arrangement 4 must be connected with contact pads on the calibration substrate 7 with a very high exactness. Only with such a precision the necessary calibration can be performed.

SUMMARY OF THE INVENTION

In a first aspect, the invention provides a procedure to reproduce the calibration position of the calibration substrate to the probe needle arrangement with a very high precision.

Preferably, the procedure of the invention permits to reproduce the calibration position within a repeatability of less than 5 µm and within a short time.

In another aspect, the invention provides a new procedure for reproduction the calibration position of an aligned and afterwards displaced calibration substrate in a probe station, which is suitable for RF calibration.

A further aspect of the invention is to provide an automatic procedure for reproduction of the calibration position relative to the probe needle arrangement.

BRIEF DESCRIPTION OF THE DRAWINGS

FIG. 1 is a schematic cross section through a wafer prober provided with a 4axis manipulator stage, a wafer chuck, an add-on plate mounted on it and a wafer as well as a calibration substrate fastened on the add-on plate and a probe needle arrangement mounted above the add-on plate within a chamber.

FIG. 1a shows the add-on plate with a wafer and a calibration substrate on it in a position outside the chamber convenient for an operator.

DETAILED DESCRIPTION

Figure 2A:
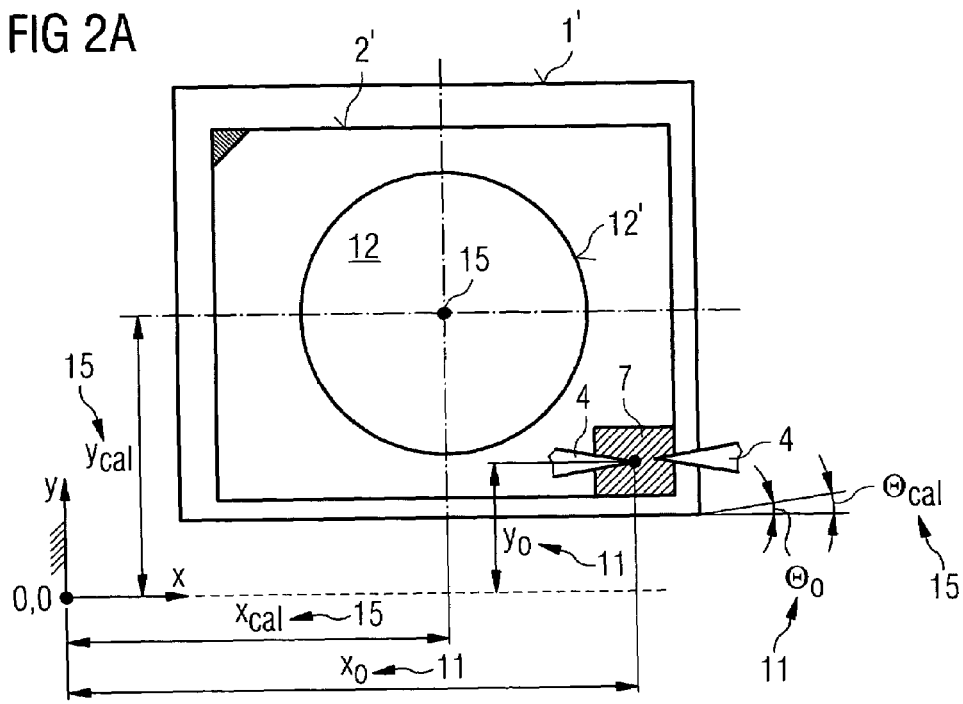
FIG. 2a is a schematic top view on the wafer chuck and the add-on plate with a wafer fastened at the centre of the add-on plate after first loading of the wafer and a calibration substrate fastened at a corner of the add-on plate.
Figure 2B:
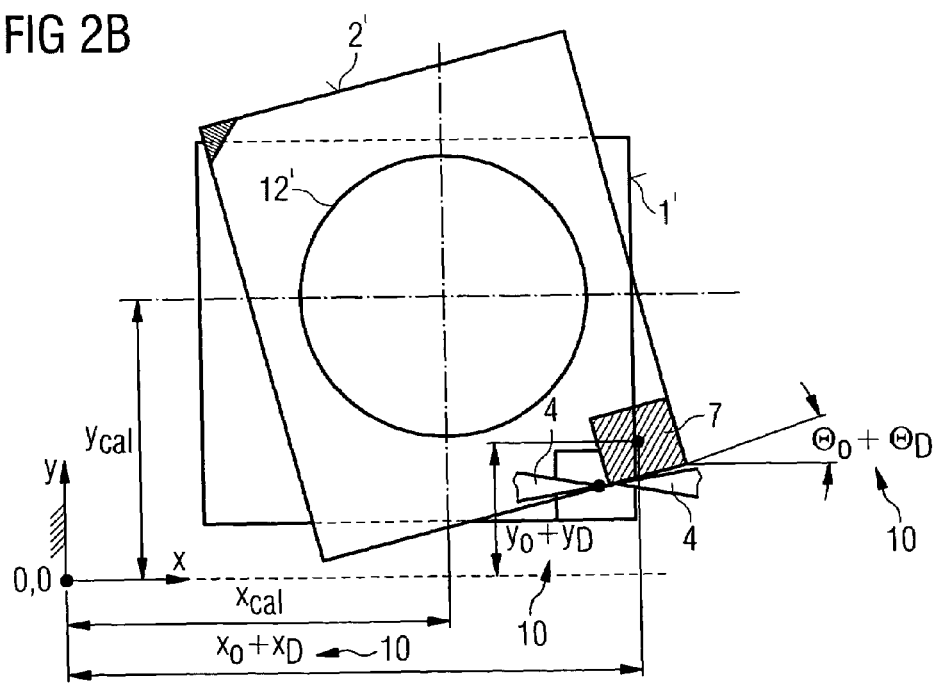
FIG. 2b illustrates the situation after unloading the first wafer and loading a second wafer with a displacement the add-on plate on the wafer chuck.
Figure 3:
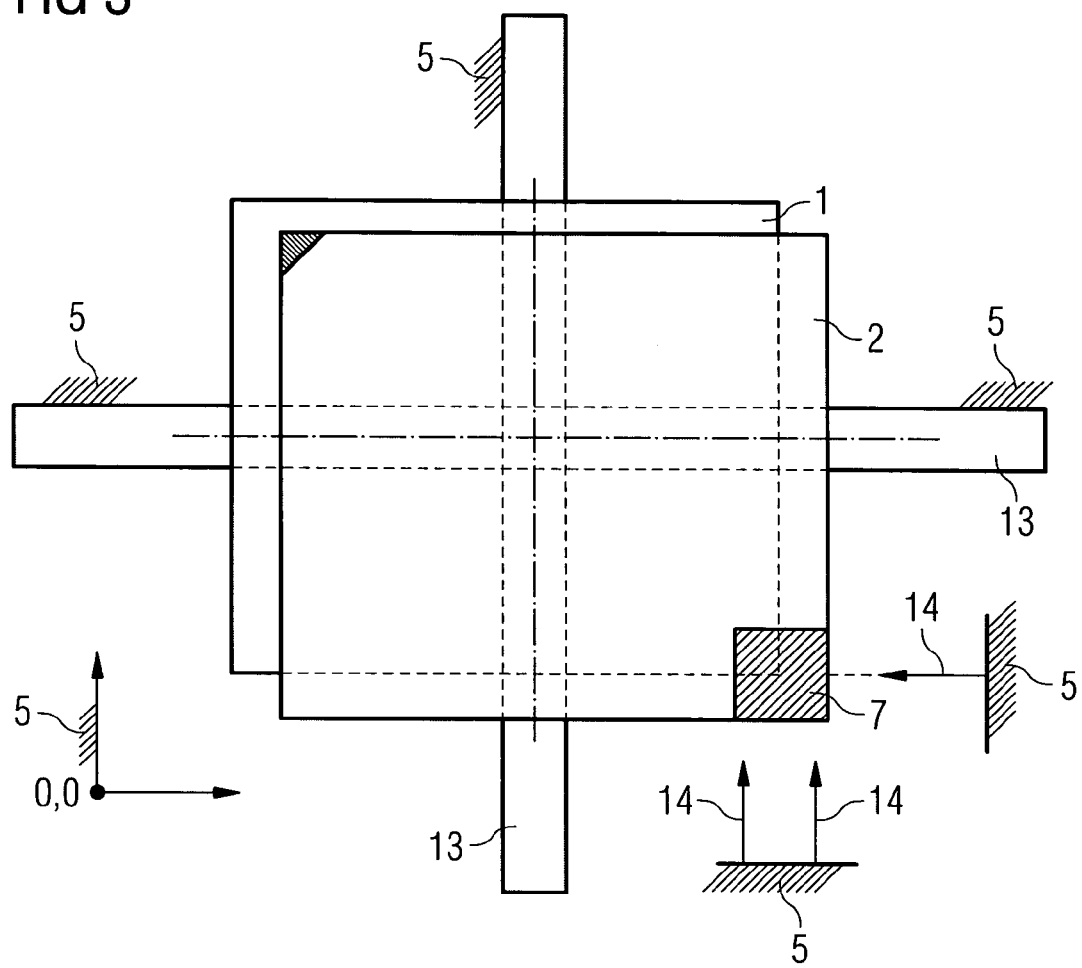
FIG. 3 illustrates schematic the position of the wafer chuck and the add-on plate relative to the machine frame and a calibration substrate on the add-on plate together with a x, y, Theta measuring system for determining the position of the calibration substrate.

The following description of the inventive procedure refers to FIG. 1-3.

As previous described the probe station has a 4axis manipulator stage 3, which includes a first x, y, z, Theta measurement system 13, which is fixed to the machine frame 5 FIG. 3). This measurement system is usually a glass scale arrangement used to determine the position $X_{cal}$, $y_{cal}$, $Theta_{cal}$ of the 4axis manipulator stage in relation to the machine coordinate system. The probe station shall be equipped furthermore with a second x, y, theta measurement system 14 which is fixed to the machine frame 5, dedicated to detect the position of the calibration substrate 7 with the coordinates $x_0$, $y_0$, $Theta_0$. This second measurement system 14 can be a known camera, e.g. provided with a CCD sensor or similar, a known mechanical/electrical measurement system e.g. a feeler with switch or a known laser displacement measurement system.

The wafer probe station is also provided with a processor and a memory device for storing the data of the first and second measuring system 13, 14 and of data calculated based on the following procedure all of which is controlled by software acting in the background. Furthermore, the wafer probe station is also provided with control means to control movement of the 4axis manipulator stage 3 and the probe needle arrangement 4.

Knowing the coordinates $x_0$, $y_0$, $Theta_0$ of the calibration substrate 7 in relation to the machine frame 5 before disconnecting the wafer chuck 1 or the add-on plate 2, continuously carrying the calibration substrate 7, from the 4axis manipulator stage 3 and knowing these coordinates after reconnecting the wafer chuck 1 or the add-on plate 2 to the 4axis manipulator 3 stage, allows to reproduce the calibration position automatically within the accuracy of the 4axis manipulator stage 3 (FIG. 2b). This can be done by the procedure described now.

The first step is loading a first wafer 12 to the add-on plate 2 and the calibration substrate 7 to the wafer chuck 1 or the add-on plate 2.

Then the first wafer 12 is aligned to the probe needle arrangement 4 with the 4axis manipulator stage 3, so that a home position (one die on the wafer 12 is aligned to the needle arrangement) can be set and stored in the mentioned memory device by software acting in the background (FIG. 2a).

The term "die" is used for semiconductor chips which are part of the wafer 12 and are processed in another semiconductor manufacturing process.

The calibration substrate 7 is aligned to the needle arrangement 4 now, such that a calibration can be carried out. This position is stored as a calibration position in the memory. This first alignment is performed by the operator under visual control of the alignment through a suitable microscope or a monitor or by an image recognition system.

Now the first location of the calibration substrate 7 relative to the machine frame 5 is determined in a defined offset distance $x_0$, $y_0$, $Theta_0$ related to the calibration position by means of the second measurement system 14 (FIG. 3).

FIG. 3 illustrates the position of the wafer chuck 1 and the add-on plate 2 relative to the machine frame 5 and the calibration substrate 7 on the add-on plate 2 together with a x, y, Theta measuring system 14 for determining the position of the calibration substrate 7.

The outer edge 2' of the add-on plate 2 is positioned within the outer edge 1' of the wafer chuck 1 and the edge 12' of the wafer 12 is positioned within the add-on plate 2. The center 15 of the 4axis manipulator stage 3 is positioned in the calibration position 15 (FIG. 2a).

After these preparation steps, the necessary wafer measurements and required calibrations can be carried out according to any program stored in the memory of the wafer probe station.

Then the tested wafer 12 can be unloaded by disconnecting the add-on plate 2 from the wafer chuck 1 or by disconnecting the wafer 12 from the wafer chuck 1 by switching off the vacuum suction in a position external the chamber 6 (FIG. 1a).

Now a second wafer 12' can be loaded by reconnecting the add-on plate 2 to the wafer-chuck 1 in a displaced position relative to the first connection position (FIG. 2b).

With the next steps the reproduction of the calibration position of the aligned and afterwards displaced calibration substrate 7 will be performed.

A second location of the calibration substrate 7 relative to the machine frame in the defined offset distance corresponding to the first location related to the calibration position by means of the measurement system 14 $x_0+x_D$, $y_0+y_D$, $Theta_0+Theta_D$ is determined (FIG. 2b).

Then the difference between the first location and second location is calculated and the defined offset distance by using this difference is corrected, getting a new offset distance.

The wafer chuck 1 is driven now by the 4axis manipulator stage 3 to the calibration position from the recent position, using the new offset distance, which will lead to the reproduced calibration position. This position is stored in the memory as recent calibration position.

The last step is aligning the second wafer 12' to the needle arrangement, so that a home position (one die on the wafer 12' is aligned to the needle arrangement) can be set and stored.

What is claimed is:

1. A procedure for exact reproduction of a calibration position of an aligned and afterwards displaced calibration substrate in a probe station having a wafer chuck mounted on a 4axis manipulator stage, a probe needle arrangement above the wafer chuck, and a first measurement system for detecting location of the wafer chuck relative to a machine frame, and a second measurement system for detecting location of the calibration substrate relative to the machine frame, comprising the steps of:
   a) loading a first wafer to the wafer chuck,
   b) loading a calibration substrate to the wafer chuck,
   c) aligning the first wafer relative to the probe needle arrangement so that a first home position aligned to the needle arrangement can be set and stored in a memory,
   d) aligning the calibration substrate to the probe needle arrangement, so that a calibration can be carried out,
   e) and storing this position as a calibration position in a memory,
   f) determining a first location of the calibration substrate relative to the machine frame in a defined offset distance related to the calibration position by means of the second measurement system,
   g) performing wafer measurements and calibrations,
   h) unloading the first wafer by disconnecting the wafer chuck from the 4axis manipulator stage, i) loading a second wafer by reconnecting the wafer chuck in a displaced position, and reproduction of the calibration position of the calibration substrate by j) determining a second location of the of the calibration substrate relative to the machine frame in the defined offset distance of step f) related to the calibration position by means of the second measurement system, k) calculating a difference between the first location and second location of the calibration substrate and correcting the defined offset distance by using that difference, getting a new offset distance, l) moving the wafer chuck to the calibration position from a recent position, using the new offset distance, which will lead to the reproduced calibration position and storing that position as a recent calibration position, and m) aligning the second wafer to the needle arrangement, so that a second home position is set and storing the second home position in a memory.

2. A procedure according to claim 1 wherein the 4axis manipulator stage for performing all movements is mounted on the machine frame.

3. A procedure according to claim 1, wherein the wafer chuck mounted on a 4axis manipulator stage and the probe needle arrangement above the wafer chuck are surrounded by a chamber.

4. A procedure according to claim 3, wherein a load/unload position of the wafer chuck is outside the chamber and is reached by moving the wafer chuck through a door in a wall of the chamber.

5. A procedure according to claim 1, wherein the first measurement system comprises a glass scale arrangement used to determine a position $x_{cal}$, $y_{cal}$, $Theta_{cal}$ of the 4axis manipulator stage in relation to the machine frame.

6. A procedure according to claim 1, wherein the second measurement system comprises a camera, provided with a CCD sensor and an image recognition system.

7. A procedure according to claim 1 wherein the second measuring system comprises a mechanical/electrical measurement system.

8. A procedure according to claim 7, wherein the mechanical/electrical measurement system comprises feelers with switches.

9. A procedure according to claim 7, wherein the mechanical/electrical measurement system comprises laser displacement measurement systems.

10. A procedure for exact reproduction of a calibration position of an aligned and afterwards displaced calibration substrate in a probe station having a wafer chuck, provided with a detachable add-on plate, mounted on a 4axis manipulator stage, a probe needle arrangement above the add-on plate, a first measurement system for detecting location of the wafer chuck and the add-on plate relative to a machine frame, and a second measurement system for detecting location of the calibration substrate relative to the machine frame, comprising the steps of:

a) loading a first wafer to the add-on plate, b) loading a calibration substrate to the add-on plate, c) aligning the first wafer relative to the probe needle arrangement, so that a first home position can be set and stored in a memory, d) aligning the calibration substrate to the probe needle arrangement, so that a calibration can be carried out e) and storing this position as a calibration position in a memory, f) determining a first location of the calibration substrate relative to the machine frame in a defined offset distance related to the calibration position by means of the second measurement system, g) performing wafer measurements and calibrations, h) unloading the first wafer by disconnecting the add-on plate from the wafer chuck, i) loading a second wafer by reconnecting the add-on plate with the wafer chuck in a displaced position, and reproduction of the calibration position of the calibration substrate by j) determining a second location of the calibration substrate relative to the machine frame in the defined offset distance of step f) related to the calibration position by means of the second measurement system, k) calculating a difference between the first location and second location of the calibration substrate and correcting the defined offset distance by using that difference, getting a new offset distance, l) moving the wafer chuck with the attached add-on plate to the calibration position from a recent position, using the new offset distance, which will lead to the reproduced calibration position and storing that position as a recent calibration position, and m) aligning the second wafer to the needle arrangement, so that a second home position can be set and storing the second home position in a memory.

11. A procedure according to claim 10 wherein the 4axis manipulator stage is mounted on the machine frame.

12. A procedure according to claim 10, wherein the wafer chuck with the attached add-on plate mounted on the 4axis manipulator stage and the probe needle arrangement above the add-on plate are surrounded by a chamber.

13. A procedure according to claim 12, wherein a load/unload position outside the chamber is reached by moving the add-on plate through a door in a wall of the chamber.

14. A procedure according to claim 10, wherein the first measurement system comprises a glass scale arrangement used to determine a position $x_{cal}$, $y_{cal}$, $Theta_{cal}$ of the 4axis manipulator stage in relation to the machine frame.

15. A procedure according to claim 10, wherein the second measurement system comprises a camera, provided with a CCD sensor and an image recognition system.

16. A procedure according to claim 10, wherein the second measuring system comprises a mechanical/electrical measurement system.

17. A procedure according to claim 16, wherein the mechanical/electrical measurement system comprises feelers with switches.

18. A procedure according to claim 16, wherein the mechanical/electrical measurement system comprises laser displacement measurement systems.

* * * * *